(12) United States Patent  (10) Patent No.: US 7,727,030 B2
Christoph et al.  (45) Date of Patent: Jun. 1, 2010

(54) DEVICE HOUSING IN PARTICULAR FOR A SENSOR FOR MOTOR VEHICLES

(75) Inventors: Markus Christoph, Regensburg (DE); Christian Plankl, Burgweinting (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/301,382

(22) PCT Filed: May 15, 2007

(86) PCT No.: PCT/EP2007/054673

§ 371 (c)(1),
(2), (4) Date: Nov. 18, 2008

(87) PCT Pub. No.: WO2007/135016

PCT Pub. Date: Nov. 29, 2007

(65) Prior Publication Data

US 2009/0197463 A1    Aug. 6, 2009

(30) Foreign Application Priority Data

May 18, 2006    (DE) ...................... 10 2006 023 471

(51) Int. Cl.
*H01R 24/00* (2006.01)
(52) U.S. Cl. ................................... 439/676
(58) Field of Classification Search ................. 439/676, 439/544, 350, 352, 677
See application file for complete search history.

(56) References Cited

U.S. PATENT DOCUMENTS 6,168,473 B1*  1/2001  Hsin ........................ 439/676
6,186,835 B1*  2/2001  Cheshire .................... 439/676
6,273,761 B1*  8/2001  Hsu et al. ................... 439/676
6,296,528 B1* 10/2001  Roberts et al. .............. 439/676
6,319,070 B1* 11/2001  Tan ........................... 439/680
6,918,794 B2*  7/2005  Wan et al. ................... 439/676
6,957,984 B1* 10/2005  Huang ....................... 439/676
6,966,798 B1* 11/2005  Wu ........................... 439/677
7,037,141 B1*  5/2006  Huang ....................... 439/676
7,192,305 B2*  3/2007  Kato et al. .................. 439/544

* cited by examiner

*Primary Examiner*—T C Patel
*Assistant Examiner*—Harshad C Patel
(74) *Attorney, Agent, or Firm*—Laurence A. Greenberg; Werner H. Stemer; Ralph E. Locher

(57) ABSTRACT

A housing for a device for mounting on an assembly surface, in particular a sensor module with a sensor for a motor vehicle, has a housing assembly surface, by way of which the housing may be brought into contact with the assembly surface and a contact socket with electrical contacts which may be electrically and mechanically connected with a complementary contact plug and running parallel to a housing plane in which the housing assembly surface is arranged. A locking device is provided with the following features: a detector for detecting a given position on the assembly surface when the housing is on contact with the assembly surface by way of the housing assembly surface, a blocking device for releasing or blocking the mechanical and/or electrical connection between the contact socket and the contact plug. The connection is released by the blocking device when the housing is in contact with the given position on the assembly surface by way of its housing assembly surface.

17 Claims, 5 Drawing Sheets

DEVICE HOUSING IN PARTICULAR FOR A SENSOR FOR MOTOR VEHICLES

BACKGROUND OF THE INVENTION

Field of the Invention

The invention relates to a housing for a device for mounting on an assembly surface, in particular a sensor module comprising a sensor for a motor vehicle.

Where the following description refers to a sensor module, this should be considered to be an example only. The invention may be generally used, independently of the purpose of the device, for all housings for mounting on an assembly surface.

In the embodiment of the device provided with electronic components as a sensor module, depending upon the type of the sensor used, a precise positional arrangement of the device on the assembly surface and correct, functional electrical contacting of the device is necessary in order be able to guarantee the intended function. A side airbag sensor module is mounted in a motor vehicle on a body component, such as, for example, the so-called B-pillar, a sill or a seat cross member.

The housings are generally made of a plastic. This has the advantage that, due to the simple production by means of an injection-molding procedure, it is possible to provide customized features, such as for example fixing points and positioning pins, for ensuring the correct installation of the sensor module.

The positional accuracy of the device, which is of essential significance for correct functioning, is ensured by the correct seating of the screw connection and the positioning pin, with it being necessary to insert the positioning pin in an opening in the assembly surface provided for this purpose. Only when the positioning pin is placed in the opening, is correct fixing of the device on the assembly surface by means the screws possible. In order to verify whether the installation of the sensor module was performed correctly, the tightening torque of the screw(s) is checked during the fixing of the housing on the assembly surface by means of the screw(s). This takes place under the assumption that only when the housing lies correctly on the assembly surface and the screw(s) are correctly engaged in a corresponding opening of the assembly surface can the specified torque be detected.

In some cases, however, it is possible that the stipulated torque of the screws can be detected even though the housing is not in its correct position. Therefore, although the housing mounted on the assembly surface appears to be positionally accurate, this is not actually the case. Under unfavorable circumstances, this may result in incorrect signals being received by the sensor. It is therefore not possible to exclude the possibility of a control unit which evaluates the signals transmitted by the sensor performing an evaluation on the basis of false or falsified signals. In the case of a sensor module for an airbag satellite, the "wrong" evaluation decision could result in the non-activation of an airbag in the case of an actual crash or activation at the wrong time etc.

BRIEF SUMMARY OF THE INVENTION

It is the object of the present invention to disclose a housing for a device for mounting on an assembly surface, in particular a sensor module comprising a sensor for a motor vehicle, which does not have the aforementioned drawbacks.

This object is achieved by a housing with the features of claim 1. Advantageous embodiments are described in the dependent claims.

A housing according to the invention for a device for mounting on an assembly surface, in particular a sensor module comprising a sensor for a motor vehicle, has the following features:

A housing assembly surface, by means of which the housing may be brought into contact with the assembly surface. A contact socket with electrical contacts which may be mechanically and electrically connected to a complementary contact plug and runs parallel to a housing plane, in which the housing assembly surface is arranged. A locking device having a detector means and a blocking means. The detector means is designed to detect a given position on the assembly surface when the housing is in contact with the housing assembly surface on the assembly surface. The blocking means is designed to release or block the mechanical and/or electrical connection between the contact socket and the contact plug, with the connection being released by the blocking means when the housing is in contact with the given position on the assembly surface by means of the housing assembly surface thereof.

The invention is therefore based on the principle of only being able to establish a mechanical and/or electrical connection between the contact socket and the contact plug when the housing is in positionally accurate contact with the assembly surface. However, if the housing does not adopt the given position on the assembly surface, this will be "indicated" during the assembly of the housing so that a mechanical connection between the contact plug, with which the electrical connection between the electronic components of the device and another component, for example a control device, is established, and the contact socket is not possible. This establishes a mechanical tangible feedback as early as during the assembly of the housing. During an electrical functional test, signals from the electronic components of the device cannot be evaluated since no electrical plug-in connection is present. This significantly increases the reliability and the verification as to whether the mounting is incorrect or not. In addition, the verification with respect to correct installation at the given position can take place blindly, that is without a visual inspection, since the feedback is tangible to an assembler.

In one embodiment, the locking device is designed to scan the surface of the assembly surface in order to determine whether the housing is in contact with the given position on the assembly surface by means of the housing assembly surface thereof. Expediently, the locking device is designed for the mechanical scanning of the assembly surface. This results in a structurally particularly simple embodiment of the locking device.

In one embodiment, the locking device is designed as a tongue which is deformable under the action of force and arranged on the housing as a type of cantilever arm extending between the contact socket and the housing plane of the housing assembly surface. The detector means and the blocking means are arranged on opposing sides, in particular on a free end, of the tongue. This enables the blocking means to function in reaction to the detector means.

In a further embodiment, it is provided that the tongue is in unloaded condition when the housing is in contact with the given position on the assembly surface by means of the housing assembly surface thereof and is in loaded condition when the housing is not in contact with the given position on the assembly surface by means of the housing assembly surface thereof. As the result of the action of a force, which is exerted through the assembly surface onto the locking device when the housing is located on the assembly surface, a deformation occurs, which serves to control the blocking means.

Expediently, the detector means is arranged on a side of the tongue facing the housing plane and protrudes in unloaded condition of the tongue over the housing plane of the housing assembly surface. This ensures that the detector means bring about a deformation of the tongue which in turn serves to control the blocking means. This enables mechanical and/or electrical contacting of the contact plug with the contact socket to be prevented. On the other hand, an unloaded condition of the locking device is necessary in order to release access to the contact socket. This can be achieved by the fact that an opening is provided in the assembly surface into which the detector means engages when the housing is in contact with the given position on the assembly surface. In this case, the detector means also adopts the function of a locking device.

Expediently, the blocking means is arranged on a side of the tongue facing the contact socket and in unloaded condition of the tongue it is located outside a plug-in area of the contact plug when the contact plug is plugged onto the contact socket. In loaded condition of the tongue, when the housing is not in contact with the given position on the assembly surface by means of the housing assembly, the blocking means is located inside the plug-in area of the contact plug so that the plugging-on of the contact plug onto the contact socket is prevented. The physical arrangement of the blocking means then takes place as a direct reaction to the detector means.

The plug-in area of the contact plug should be understood as meaning the region which is necessary in order to be able to plug the contact plug onto the contact socket. Substantially, the plug-in area corresponds to the thickness of a housing wall of the contact plug and hence approximately to the dimension formed between the circumference of the contact socket and the blocking means when the tongue is in unloaded condition.

In one embodiment, the detector means is embodied as a projection having a back arranged at an angle with respect to the housing plane, with the angle being selected in such a way that, in loaded condition of the tongue in which the housing is not in contact with the given position on the assembly surface, the back runs substantially parallel to the housing plane. This has the advantage that when the detector means is moved laterally to the assembly surface it creates a slight friction.

In a further embodiment, the blocking means is embodied as a projection having a back, which is arranged at an angle with respect to the housing plane, with the angle being selected in such a way that, in loaded condition in which the housing is not in contact with the given position on the assembly surface, the back runs substantially parallel to the housing plane. This results in a skewed plane of the back when the detector means is in unloaded condition. This facilitates the plugging-on of the contact plug onto the contact socket.

Preferably, the distance between the contact socket and the blocking means is greater than a housing thickness of the contact plug and smaller than the sum of the housing thickness of the contact plug and the height of the projection serving as a detector means. One advantage of this variant consists in the fact that the detachment of the housing from the assembly surface is prevented as long as the contact plug remains plugged-on. This means that detachment with respect to the given position from the given position of the housing is no longer possible as soon as the contact plug is plugged onto the contact socket.

In an expedient embodiment, the width of the locking device parallel to the housing plane is such that deformation parallel to the housing plane is not possible. Hereby, the width of the locking device can approximately correspond to the width of the contact socket.

In a further expedient embodiment, the circumference of the housing assembly surface has a substantially trapezoidal or wedge-shaped shape. The tapering preferably takes place in the direction of the contact socket. This enables assembly via a lateral plug-in unit into a stop of the assembly surface, which has a bend. The stop represents a type of guide into which the housing may be pushed until the given position is reached.

A further embodiment envisages that at least one projection serving as an end stop runs in the orthogonal direction from the housing assembly surface to the housing plane of the housing assembly surface. This also adopts the role of a guide, which facilitates easier positioning of the housing on the assembly surface until the given position is reached.

It is further preferable for the housing and the locking device to be formed from a moldable plastic and the locking device to be an integral component of the housing.

The invention will be described in more detail below with reference to an exemplary embodiment in the drawings which show:

DESCRIPTION OF THE INVENTION

Figure 1A:
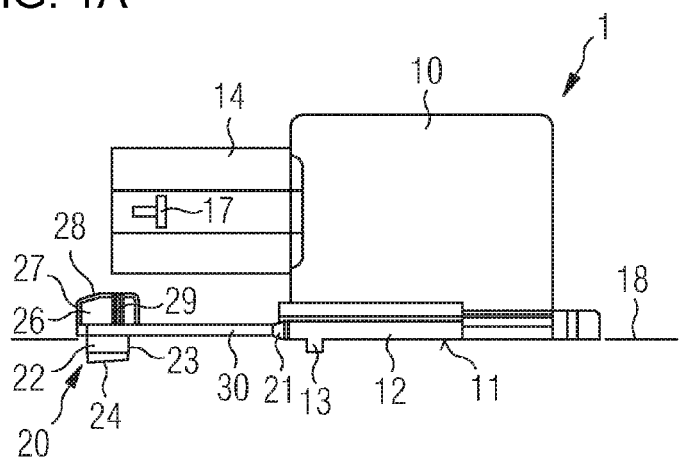
FIGS. 1A-1C A housing according to the invention for a sensor module in a side view, top view and frontal view FIG. 2 A top view of an assembly surface on which the housing according to the invention is to be mounted FIG. 3 A sectional view of a housing according to the invention which is arranged on an assembly surface outside its given position FIGS. 4A-4C A side view, a top view and a front view of the housing placed on the assembly surface, wherein this is not in its given position FIG. 5 A section through a housing according to the invention which is arranged on an assembly surface and is located in a given position FIGS. 6a-6C A side view, a top view and a front view of the housing according to the invention which is located in the given position on the assembly surface
Figure 1B:
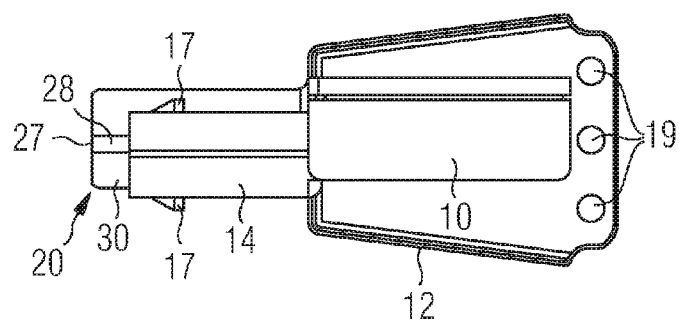
Figure 1C:
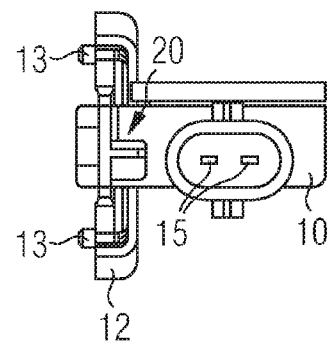

The depiction in the FIG. 1A to 1C shows a housing according to the invention 10 for a sensor module 1 in a side view, a top view and a front view. The sensor module 1 can be, for example, a so-called side airbag satellite sensor. In the interior of the housing, and not evident from the figures, a plurality of electronic components and a sensor are arranged on a board to detect an acceleration, a structure-borne signal or the like. Since the design of the sensor module and the components required for this are of no significance for the present invention, no detailed description will be given at this point. In principle, the housing according to the invention 10 can be used for any type of electronic circuit or any electronic device for which precise positioning on an assembly surface is required.

The housing 10 has a contact socket 14 which comprises contact pins 15 in a known way. This example of an embodiment depicts two contact pins 15, with this only being shown by way of example. The contact socket 14 runs parallel to a housing plane 18. A housing assembly surface 11 of the housing is placed in the housing plane 18. The housing 10 is mounted with the housing assembly surface 11 on the assembly surface (described below). Furthermore, two opposing projections 17 are provided on the contact socket 14. As will become clear from the following description, these are necessary for the assembly with a contact plug, with the projections 17 serving as a barb or stop for the contact plug. In the top view (FIG. 1B), the projections 17 are approximately wing-shaped.

A locking device 20 runs between the contact socket 14 and the housing plane 18. The locking device 20 is embodied as tongue 30 which is deformable under the action of force and arranged on the housing as a type of a cantilever arm. The tongue 30 is connected to the housing 10 on a bearing 21 which is arranged above the housing plane 18.

Preferably, the housing 10 and the locking device 20 are formed in one piece and integrally from a moldable plastic.

The tongue 30 runs substantially parallel to the housing plane 18 beyond the end of the contact socket 14. Arranged on two opposing sides of the tongue 30 on the end of the tongue 30 facing away from the bearing 21 are two projections 22 and 26. The projection 22, which arranged on the side of the tongue 30 facing the housing plane 18, represents a detector means, which, in unloaded condition of the tongue, runs beyond the housing plane 18. This is clearly evident in FIG. 1A. The projection 26 facing the contact socket 14 represents a blocking means.

The hollow (see reference number 25 in FIG. 3) detector means 22 has a back 24, which is arranged at an acute angle relative to the housing plane 18. When the tongue 30 is loaded, the oblique arrangement of the back 24 serves to provide a substantially parallel alignment to the housing plane 18. Furthermore, the detector means 22 has a contact surface 23, which, as is evident from the following description of the figures, enables the housing 10 to be locked to the assembly surface when the housing 10 is arranged in the given position on the assembly surface.

The blocking means 26 has a contact surface 27, which is arranged perpendicular to the housing plane 18 and outside the contact socket 14. The contact surface 27 is arranged in a plug-in area of the contact plug 14 when the tongue 30 is in loaded condition. A back 28 is also arranged at an acute angle relative to the housing plane 18. If the tongue 30 is in unloaded condition shown in FIG. 1A, the plugging-on of the contact plug onto the contact socket 14 is made easier. For increased stability, two opposing flange-shaped sections 29 are also arranged on the blocking means 26.

The width of the tongue 30 is dimensioned in such a way that lateral deflection, which means deflection parallel to the housing plane 18, is not possible. In this exemplary embodiment, therefore, the width of the tongue 30 approximately corresponds to the width of the contact socket 14, which is clearly evident from FIGS. 1B and 1C.

By way of example, also embodied on the housing 10 are three openings 19, which are used for the accommodation of coding pins (see FIG. 1B). The coding pins can be used, for example, to mark the type and/or arrangement of the sensor for the assembly.

FIG. 1B also clearly reveals the wedge-shaped or trapezoidal shape of the circumference of the housing assembly surface (reference number 12).

Embodied on the lower side of the housing 10 are two projections 13 serving as end stops and guides (see FIGS. 1A and 1C), which protrude out of the housing assembly surface.

Figure 2:
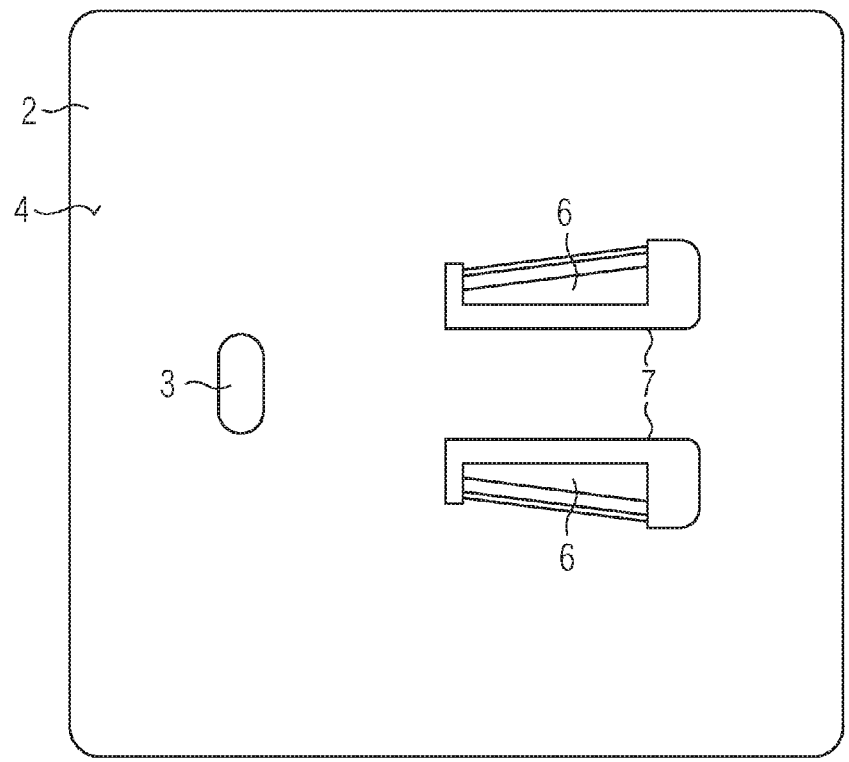

The wedge-shaped or trapezoidal design of the circumference of the housing assembly surface is linked to the type of fastening of the housing 10 of the sensor module 1 on the assembly surface. FIG. 2 shows by way of example a top view of an assembly surface 2. Two opposing stops 6 can be identified, each of which having a bend, facing each other. Provided in the region of the stops are openings 7 which engage with the two end stops 13 embodied on the lower side of the housing 10. As is immediately evident, the stops 6 are arranged at an angle to each other which is adapted to match the circumferential shape of the housing assembly surface 12. The assembly surface 2 also has an opening 3 into which the detector means 22 latches as soon as the housing 10 has achieved its given position on the assembly surface 2.

The interaction of the housing according to the invention with the described assembly surface 2 is shown more clearly in FIGS. 2 to 6.

Figure 3:
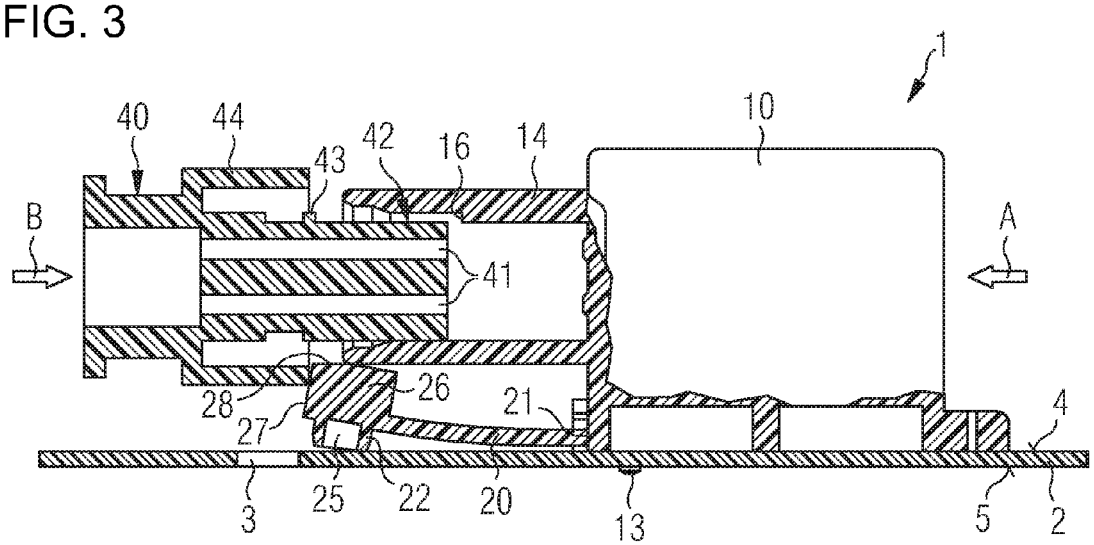
Figure 4A:
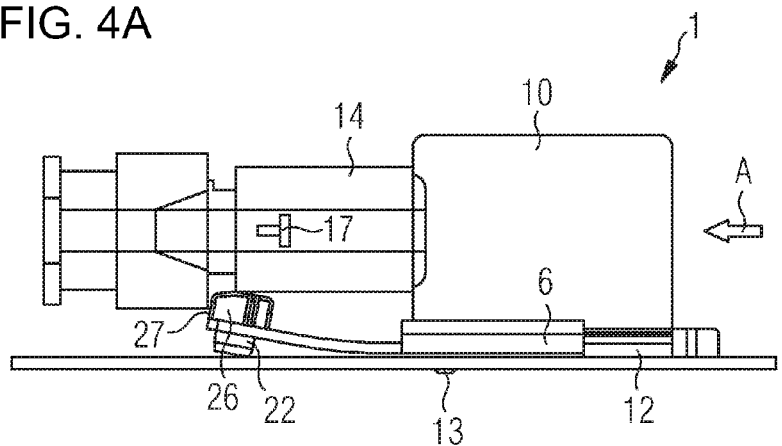
Figure 4B:
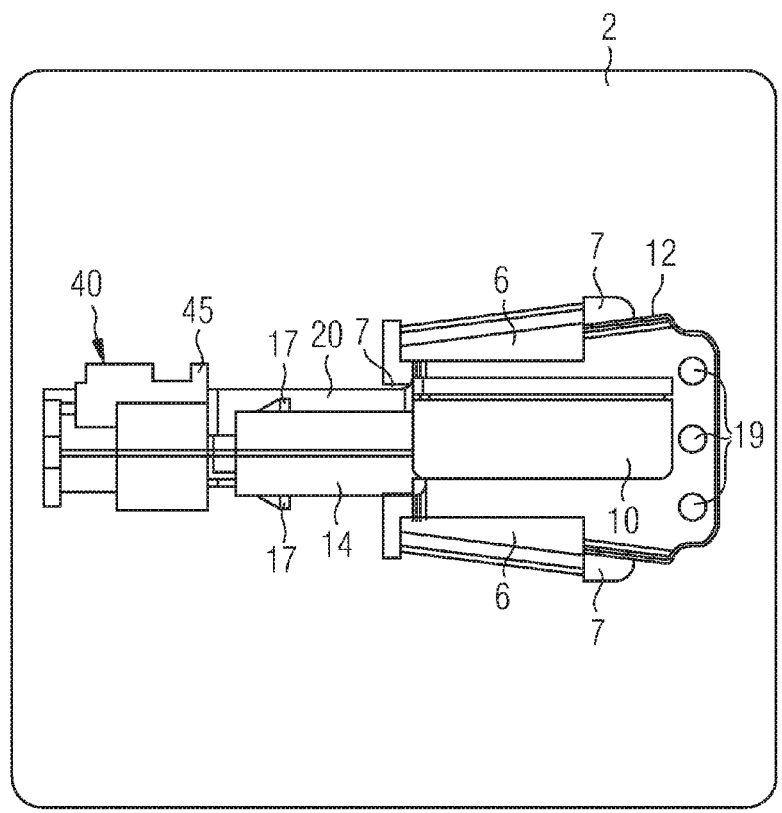
Figure 4C:
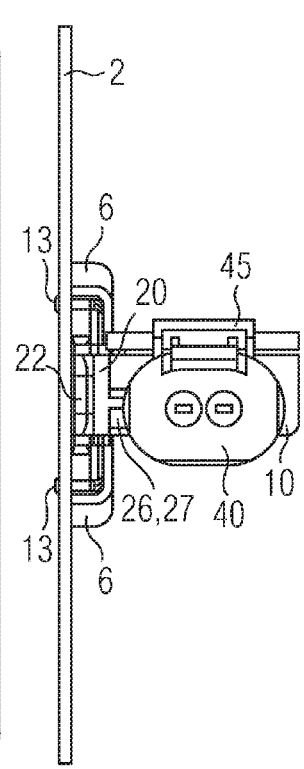

Hereby, FIGS. 3 and 4A to 4C show a situation in which the housing 10 is in contact with the assembly surface 2, wherein the given position has not yet been achieved. FIG. 3 hereby shows a section through the system formed, while FIGS. 4A, 4B and 4C show a side view, a top view and a front view respectively.

Reference number A denotes a direction of movement of the housing 10, with it being necessary to push the housing 10 along the stops 6 of the assembly surface 2 in the direction of the given position thereof.

Reference number B denotes the direction of movement of the contact plug 40 which has to be performed for the mechanical and electrical contacting of the contact socket 14.

The detector means 22 projecting over the housing plane 18, in which the housing assembly surface 11 is placed, results in loading of the locking device 20 in the direction of the contact socket 14. Hereby, the back 24 of the detection means 22 is substantially in full contact with the assembly surface 2. The back 28 of the blocking means 26 is pressed in the direction of the contact socket 14 with this making it possible for them to come into contact. The contact surface 27 is hereby pushed into a plug-in area. This denies a contact plug 40 access to the contact socket 14 so that a mechanical and electrical contacting of contact socket 14 and contact plug 40 is not possible according to the intended purpose.

The contact plug 40 has a plug-in section 42 with hollow conductors 41, into which the contact pins 15 of the contact socket 14 have to be introduced. Due to the blocking means arranged in the plug-in area, the plug-in section 42 cannot be fully pushed into the contact socket 14. The contact surface 27 of the blocking means 26 functions as a stop and hence as a mechanical block for the contact plug 40.

The contact plug 40 also has a coding pin 43 which is embodied on the side of the plug-in section 42. The coding pin 43, which can arrive at a stop at a shoulder 16 in the interior of the contact socket 14, serves as an anti-rotation element. This ensures that the contact plug 40 can only be brought into contact with the contact socket 14 in a certain position.

Moreover, embodied in a rear section of the contact plug is a housing jacket 44 which, in the case of correct mechanical contacting with the contact socket 14, reaches round the contact socket 14 so that, by means of a locking element 45, locking with a projection 17 embodied as a barb or stop can take place. It is particularly clearly evident from FIG. 4B that the locking element 45, which is embodied on the housing jacket 44 of the contact plug, can be brought into contact with the projections 17 on the contact socket 14 due to the position of the blocking means 26.

On the other hand, FIGS. 5 and 6A to 6C show a situation in which the housing 10 is arranged in the given position on the assembly surface 2 so that a mechanical and electrical contacting between contact plug 40 and contact socket 14 or the electrical conductors embodied therein can take place.

Figure 5:
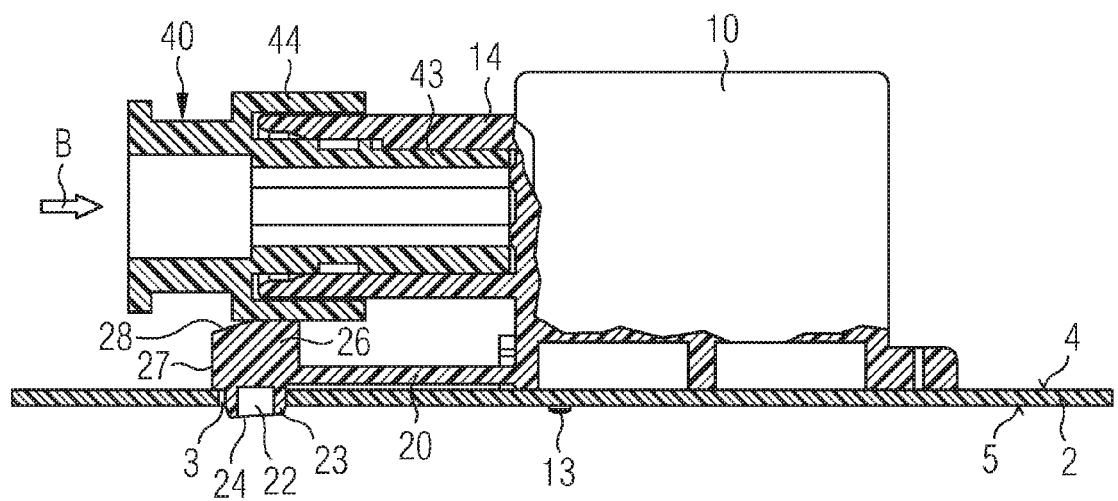
Figure 6A:
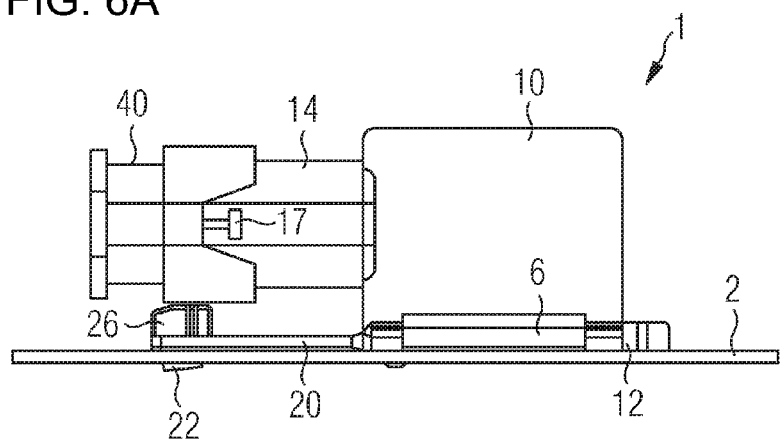
Figure 6B:
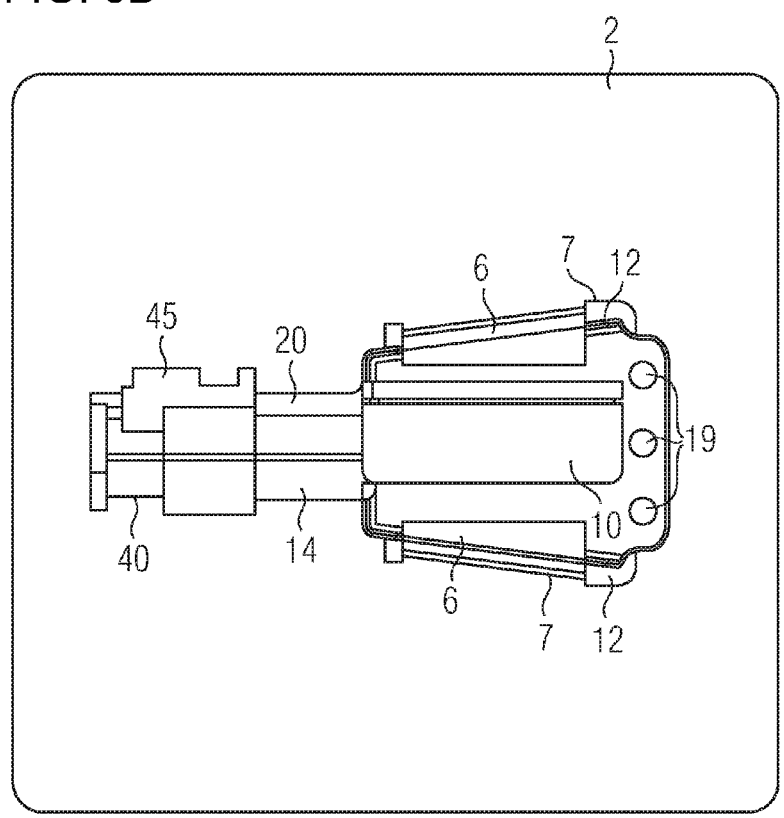
Figure 6C:
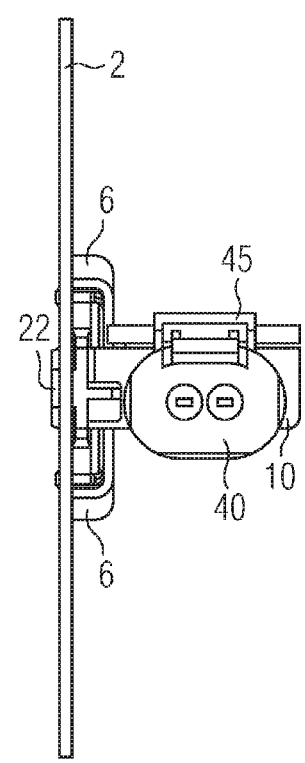

As seen best in FIG. 5, the detector means 22 engages in the opening 3 of the assembly surface 2. This produces sufficient space (designated above as the plug-in area) between the blocking means 26 and the contact socket 14 for the contact plug 40 to be plugged onto the contact socket 14. The distance between the blocking means 26 and the circumference of the contact socket 14 is hereby selected in such a way that a smaller gap forms between the blocking means 26 and the circumference of the housing jacket 44. The oblique back 28 hereby facilitates the guidance and the plugging-on of the contact plug 40 onto the contact socket 14. Since a contact surface 23 is in engagement with the border of the opening 3, due to the selected dimensions, the detector means 22 now serves as a locking device for the housing 10. The detachment of the housing 10 from the assembly surface 2 is not possible as long as the contact plug 40 is plugged onto the contact socket 14.

In order to avoid the incorrect mounting of a housing for an electrical device and to make installation as simple and reliable as possible, the invention proposes the embodiment of a locking mechanism for the contact plug in the form of a snap hook on the housing. This is preferably embodied in one piece and integrally on the housing so that additional parts and assembly costs are dispensed with.

As long as the housing is not mounted in its given position (final position), the locking device designed as a snap hook is elevated and blocks the plugging-on of the contact plug. An electrical contact between the device and a central control device is then not possible, which can be detected during a functional test.

However, when the housing is located in its correct, given position (final position), the locking device designed as a hook latches in and releases the access for the plugging-on of the contact plug. If the contact plug is plugged on, this again blocks the locking mechanism, which can then no longer be opened. This makes it impossible to disassemble the housing from the assembly surface without previously having detached the contact plug.

The invention claimed is:

1. A housing for mounting a device on an assembly surface, comprising:
   a housing assembly surface for placing the housing in abutment contact with the assembly surface;
   a contact socket with electrical contacts for mechanical and electrical connection to a complementary contact plug, said contact socket running parallel to a housing plane containing said housing assembly surface; and
   a locking device having:
      a detector configured to detect a given position on the assembly surface when the housing is in contact with the assembly surface by way of said housing assembly surface; and
      a blocking means configured to selectively block at least one of the mechanical and electrical connections between said contact socket and the contact plug, said blocking means unblocking the respective connection when said housing assembly surface of the housing is in contact at said given position with the assembly surface.

2. The device housing according to claim 1, wherein said locking device is configured to scan a surface of the assembly surface in order to determine whether the housing is in contact with the given position on the assembly surface by way of said housing assembly surface.

3. The device housing according to claim 2, wherein said locking device is configured for mechanically scanning the assembly surface.

4. The device housing according to claim 1, wherein said locking device is a tongue which is deformable under an action of force and which is arranged on the housing as a cantilever arm extending between said contact socket and said housing plane containing said housing assembly surface.

5. The device housing according to claim 4, wherein said detector and said blocking means are disposed on mutually opposite sides of said tongue.

6. The device housing according to claim 5, wherein said detector and said blocking means are disposed on a free end of said tongue.

7. The device housing according to claim 4, wherein said tongue:
   is in an unloaded condition when the housing is in contact with said given position on the assembly surface by way of said housing assembly surface; and
   is in a loaded condition when the housing is not in contact with said given position on the assembly surface by way of said housing assembly surface.

8. The device housing according to claim 7, wherein said detector is arranged on a side of said tongue facing said housing plane and, in the unloaded condition of said tongue, protrudes over said housing plane containing said housing assembly surface.

9. The device housing according to claim 7, wherein said blocking means is arranged on a side of said tongue facing said contact socket and said blocking means:
   in the unloaded condition of said tongue, is disposed outside a plug-in area of the contact plug when the contact plug is plugged onto said contact socket; and
   in the loaded condition of said tongue when the housing is not in contact with said given position on the assembly surface by way of said housing assembly surface thereof, is disposed inside the plug-in area of the contact plug so that the contact plug cannot be plugged onto said contact socket.

10. The device housing according to claim 4, wherein said detector comprises a projection having a back arranged at angle with respect to said housing plane, and said angle is selected to position said back to run substantially parallel to said housing plane in a loaded condition of said tongue, in which the housing is not in contact with said given position on the assembly surface.

11. The device housing according to claim 10, wherein a distance between said contact socket and said blocking means is greater than a housing thickness of said contact plug and smaller than a sum of the housing thickness of the contact plug and a height of said projection serving as said detector.

12. The device housing according to claim 1, wherein said blocking means comprises a projection having a back arranged at an angle with respect to said housing plane, and said angle is selected to position said back to run substantially parallel to said housing plane in a loaded condition thereof in which the housing is not in contact with said given position on the assembly surface.

13. The device housing according to claim 1, wherein said locking device has a width, parallel to said housing plane, to render deformation parallel to said housing plane impossible.

14. The device housing according to claim 1, wherein a circumference of said housing assembly surface (11) has a substantially trapezoidal shape or wedge shape.

15. The device housing according to claim 1, which comprises at least one projection serving as an end stop running from said housing assembly surface in an orthogonal direction to said housing plane containing said housing assembly surface.

16. The device housing according to claim 1, wherein the housing and said locking device are formed from a moldable plastic and said locking device is an integral component of the housing.

17. The device housing according to claim 1, containing a sensor module comprising a sensor for a motor vehicle.

* * * * *